United States Patent [19]

Kniat et al.

[11] Patent Number: 4,504,030
[45] Date of Patent: Mar. 12, 1985

[54] COOLING MEANS

[75] Inventors: John Kniat, Glastonbury; Joel F. Kuhlberg, New Hartford; Daniel A. Mickey, Broad Brook, all of Conn.

[73] Assignee: United Technologies Corporation, Hartford, Conn.

[21] Appl. No.: 447,361

[22] Filed: Dec. 6, 1982

[51] Int. Cl.³ .................... B64D 33/08; F02K 3/04
[52] U.S. Cl. .................... 244/57; 60/39.83; 244/117 A; 361/384
[58] Field of Search ............ 244/53 R, 57, 117 A; 60/266, 39.83, 39.07, 226.1; 361/383, 384

[56] References Cited

U.S. PATENT DOCUMENTS

| | | | |
|---|---|---|---|
| 2,434,085 | 1/1948 | Suggs | 244/57 |
| 2,865,580 | 12/1958 | Marshall | 244/57 |
| 4,007,891 | 2/1977 | Sorensen et al. | 244/53 B |
| 4,086,761 | 5/1978 | Schaut et al. | 60/226.1 |
| 4,156,344 | 5/1979 | Cuthbertson et al. | 60/226.1 |
| 4,182,119 | 1/1980 | Hurley | 60/226.1 |
| 4,351,150 | 9/1982 | Schulze | 60/266 |

Primary Examiner—Galen L. Barefoot
Attorney, Agent, or Firm—Norman Friedland

[57] ABSTRACT

Cooling for an electronic package mounted on an aircraft engine housed in a nacelle is achieved by connecting the package to the inlet of the engine and overboard of the nacelle so that substantially continuous air flow over the electronic package will ensue from either direction depending on the varying pressure gradients adjacent the points where connections are made and the conditions exists during the flight envelope. This negates the necessity of providing positive pumping devices for effectuating the flow of the cooling air.

3 Claims, 1 Drawing Figure

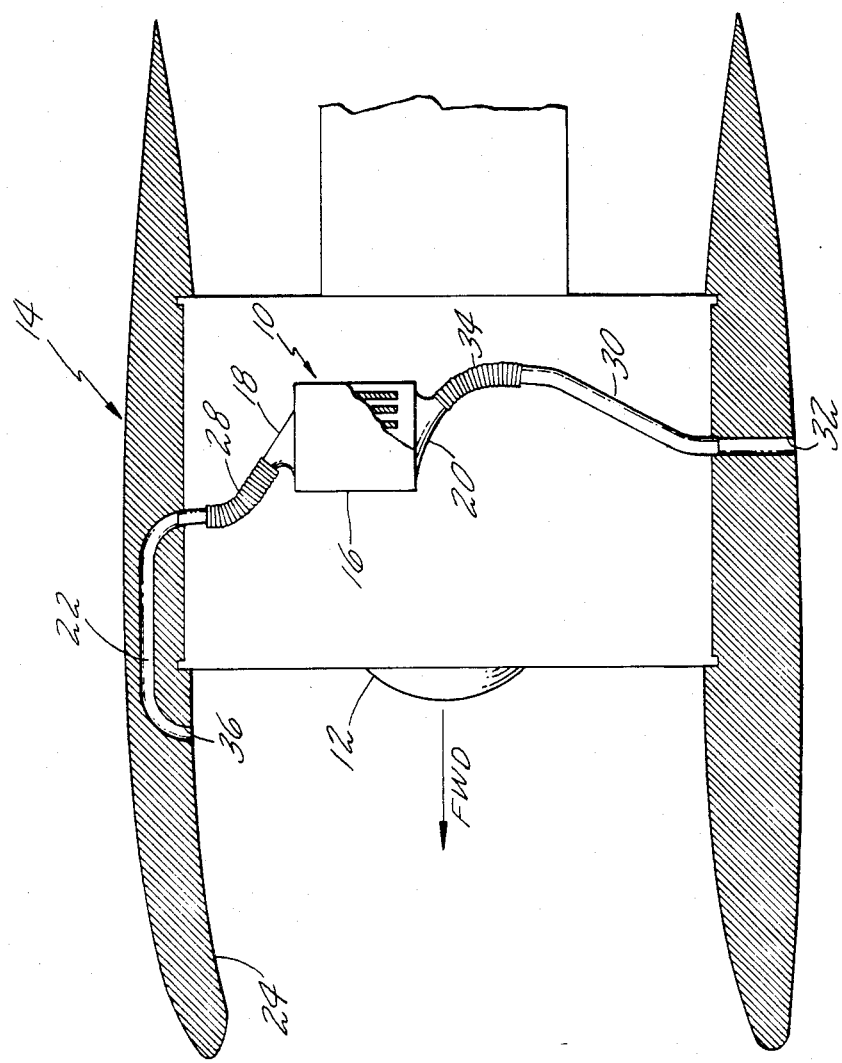

COOLING MEANS

TECHNICAL FIELD

This invention relates to aircraft and particularly to means for cooling electronics housed in proximity to the aircraft's engine.

BACKGROUND ART

As is well known, the hostile environment as that imposed by a jet engine, can adversely affect the operation of the electronics. It therefore is necessary to cool these electronic packages. While there are a number of well known methods of cooling, as for example, tapping into the aircraft's airconditioning system, utilizing heat exchangers cooled by fuel, forced air cooling by ejectors, these methods in one way or another impose a penalty on the engine and aircraft performance.

We have found that we can provide a simple automatic cooling system for the electronics packaged on the engine that is housed in the nacelle compartment without incurring an adverse penalty on the engine and/or aircraft performance. According to this invention, air taps adjacent the engine inlet and on the overboard station of the nacelle are interconnected with the electronics package with suitable connecting lines to flow cool air over the electronic package during the aircraft flight envelope. Under certain operating conditions, the tap at the engine inlet serves as the cooling system's inlet and the overboard tap serves as the exhaust and under other operating conditions the reverse occurs, namely the inlet becomes the outlet and vice versa.

DISCLOSURE OF INVENTION

An object of this invention is to provide for aircraft improved means for cooling electronic packages. A feature of this invention is a self-actuating ejector having an inlet/outlet tapped in the inlet to the engine and an outlet/inlet overboard tapped on the outside of the nacelle serves to flow air over the electronic package during the engine operating envelope where at certain aircraft operating regimes flow is from the inlet of the engine's inlet overboard through the nacelle and in other operating regimes the reverse is the case. Such a system is characterized as being relatively simple, does not rely on other components of the aircraft and engine, does not require any forced air as by an ejector and is relatively free from incurring engine and nacelle performance penalties. In addition, such a system is relatively simple to maintain and is relatively light in weight.

Other features and advantages will be apparent from the specification and claims and from the accompanying drawings which illustrate an embodiment of the invention.

BRIEF DESCRIPTION OF THE DRAWING

The sole FIGURE, is a schematic illustration of this invention.

DESCRIPTION OF THE PREFERRED EMBODIMENT

As can be seen in the sole FIGURE, the electronic package generally indicated by reference numeral 10 is mounted on the engine 12 in the fan compartment defined by the nacelle 14. The package is enclosed in a heat-exchanger like casement 16 with headers 18 and 20 disposed at either end. Well-known fins in the enclosure would be utilized to achieve a higher rate of heat transfer if necessary. Conduit means, including tubing 22 tapped in the inlet 24 of the engine is interconnected to header 18 by flexible tube 28 which may be fabricated from some well known heat resistant material such as Teflon material. Similarly, conduit means including a tubing 30 interconnects the opening 32 tapped in the nacelle wall to communicate ambient with header 20 via the flexible tubing 34. The flexible tubing would be desirable in the event it is necessary to isolate the electronic package from the vibratory environment. This would allow the package to move independent of the engine case.

During ground idle, static airplane condition, the airflow drawn into the engine by the fan blades will create a pressure level that is lower than that outside the nacelle. In this case, air will be drawn into the tubing at opening 32 and pulled over the electronic unit by the lower pressure in the engine inlet existing at the opening 36 and exhausting into the inlet 24 of the engine. The air is cooler than any other air source, being equal to outside air temperature. This process will continue until the aircraft picks up enough forward velocity, where the pressure at opening 32 becomes lower than that at opening 36, and the cooling airflow now reverses direction. There will exist a point where no flow is expected during the flight. This is a condition of higher aircraft speed at higher altitude, and is a cooler condition that is transiently tolerated.

What has been disclosed by the invention is means to air cool an electronic control unit utilizing the natural aspiration characteristics of the engine inlet air stream, with a minimum weight impact, no measurable engine or nacelle performance penalty and no adverse effects in the maintainability.

Although this invention has been shown and described with respect to a preferred embodiment, it will be understood by those skilled in the art that various changes in form and detail thereof may be made without departing from the spirit and scope of the claimed invention.

We claim:

1. Cooling means for an electronic package mounted on a gas turbine engine housed in a nacelle of an aircraft consisting of a first connection means for interconnecting the electronic package and the inlet of the engine, a second connection means interconnecting said electronic package, said first connection means and the ambient overboard of said nacelle, the opening of said first connection means relative to said engine inlet and the opening of said second connection means relative to said ambient overboard being located relative to pressure gradients acting on said nacelle and said inlet being selected so that the flow of air automatically flows from said opening of said first connection means and discharging through the opening of said second connection means and alternately from said opening of said second connection means and discharging through said opening of said first connection means dependent on the pressure gradients adjacent said opening of said first connection means and said opening of said second connection means.

2. Cooling means as claimed in claim 1 including a casing encasing the electronic components of said electronic package, a pair of headers attached to said casing, one of said pair of headers connected to said first connection means and the other of said pair of headers connected to said second connection means.

3. Cooling means as claimed in claim 2 including cooling fins disposed in said casing.

* * * * *